(12) United States Patent
Hatano et al.

(10) Patent No.: US 11,921,162 B2
(45) Date of Patent: Mar. 5, 2024

(54) INFORMATION PROCESSING DEVICE, INFORMATION PROCESSING METHOD, NON-TRANSITORY COMPUTER READABLE MEDIUM, AND INFORMATION PROCESSING SYSTEM

(71) Applicant: KABUSHIKI KAISHA TOSHIBA, Tokyo (JP)

(72) Inventors: Hisaaki Hatano, Yokohama (JP); Takahiro Yamamoto, Fuchu (JP); Kohei Maruchi, Setagaya (JP); Kenichi Fujiwara, Kawasaki (JP); Masatake Sakuma, Chiba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 83 days.

(21) Appl. No.: 17/469,431

(22) Filed: Sep. 8, 2021

(65) Prior Publication Data

US 2021/0405120 A1 Dec. 30, 2021

Related U.S. Application Data

(63) Continuation of application No. PCT/JP2020/011841, filed on Mar. 17, 2020.

(51) Int. Cl.
*G01R 31/367* (2019.01)
*G01R 31/36* (2020.01)
(Continued)

(52) U.S. Cl.
CPC ....... *G01R 31/367* (2019.01); *G01R 31/3648* (2013.01); *G01R 31/388* (2019.01); *G01R 31/396* (2019.01)

(58) Field of Classification Search
CPC .......................... G01R 31/396; G01R 31/367
(Continued)

(56) References Cited

U.S. PATENT DOCUMENTS 7,688,033 B2    3/2010  Minamiura
9,093,844 B2 *  7/2015  Yonezawa ................ H02J 7/00
(Continued)

FOREIGN PATENT DOCUMENTS

JP      4668015 B2    4/2011
JP      6134438 B1    5/2017
(Continued)

OTHER PUBLICATIONS

International Search Report dated Aug. 11, 2020 in PCT/JP2020/011841, filed on Mar. 17, 2020, 4 pages (with English Translation of Categories of Cited Documents).

(Continued)

*Primary Examiner* — Ricky Go
(74) *Attorney, Agent, or Firm* — Oblon, McClelland, Maier & Neustadt, L.L.P.

(57) ABSTRACT

According to one embodiment, the information processing device includes: a first state estimator configured to estimate a state of a target rechargeable battery based on: first data including a charge amount and voltage value of a rechargeable battery; information including a state of the rechargeable battery; and second data including a charge amount and voltage value of the rechargeable battery.

15 Claims, 10 Drawing Sheets

(51) Int. Cl.
  *G01R 31/388* (2019.01)
  *G01R 31/396* (2019.01)

(58) Field of Classification Search
  USPC .......................................................... 702/63
  See application file for complete search history.

(56) References Cited

U.S. PATENT DOCUMENTS

| | | | |
|---|---|---|---|
| 10,193,198 B2 | 1/2019 | Ishibashi | |
| 10,372,183 B2 | 8/2019 | Yamamoto et al. | |
| 10,500,970 B2 | 12/2019 | Kawamura et al. | |
| 2006/0276980 A1* | 12/2006 | Mizuno | G01R 31/3648 |
| | | | 320/128 |
| 2015/0276889 A1 | 10/2015 | Osaka et al. | |
| 2017/0031404 A1* | 2/2017 | Yamamoto | G01R 31/392 |
| 2017/0263984 A1* | 9/2017 | Fujita | G01R 31/392 |
| 2018/0267108 A1* | 9/2018 | Morita | H01M 10/486 |
| 2020/0003839 A1 | 1/2020 | Yamamoto et al. | |
| 2020/0072910 A1 | 3/2020 | Kusano et al. | |
| 2020/0233037 A1 | 7/2020 | Yamamoto et al. | |

FOREIGN PATENT DOCUMENTS

| | | |
|---|---|---|
| JP | 2017-181329 A | 10/2017 |
| JP | 6370581 B2 | 8/2018 |
| JP | 2018-146372 A | 9/2018 |
| JP | 2019-61741 A | 4/2019 |
| JP | 2020-34524 A | 3/2020 |
| JP | 2020-119712 A | 8/2020 |
| WO | WO 2016/147572 A1 | 9/2016 |

OTHER PUBLICATIONS

Hoshino et al., "Battery Inspection Technology Employing Charging Curve Analysis for Long-Term Use of Lithium-Ion Batteries and Its Applicability", vol. 68 No.10, 2013, 11 pages (with English translation).

* cited by examiner

| BATTERY ID | TIME | VOLTAGE | CURRENT | SoC | ELECTRIC POWER | TEMPERATURE | ... |
|---|---|---|---|---|---|---|---|
| BATTERY 1 | 2018/3/10 10:00:00 | v1 | i1 | 80.5 | p1 | 25.2 | ... |
| BATTERY 1 | 2018/3/10 10:00:01 | v2 | i2 | 80.3 | p2 | 25.2 | ... |
| BATTERY 1 | 2018/3/10 10:00:02 | v3 | i3 | 80.2 | p3 | 25.3 | ... |
| BATTERY 1 | 2018/3/10 10:00:03 | v4 | i4 | 80.0 | p4 | 25.3 | ... |
| ⋮ | ⋮ | ⋮ | ⋮ | ⋮ | ⋮ | ⋮ | |

| BATTERY ID | MEASUREMENT CONDITION | CONDITION VALUE | CURVE DATA | TEMPERATURE | DETERIORATION STATE |
|---|---|---|---|---|---|
| BATTERY A | CONSTANT CURRENT CHARGE | 1C | ⌒ | T1 | 68.1 |
| BATTERY A | CONSTANT CURRENT CHARGE | 3C | ⌒ | T1 | 68.9 |
| BATTERY A | OCV | - | ⌒ | T1 | 68.6 |
| ... | ... | ... | ... | ... | ... |
| BATTERY B | ... | ... | ... | ... | ... |
| ... | ... | ... | ... | ... | ... |
| BATTERY C | ... | ... | ... | ... | ... |
| ... | ... | ... | ... | ... | ... | ized to an embodiment.
INFORMATION PROCESSING DEVICE, INFORMATION PROCESSING METHOD, NON-TRANSITORY COMPUTER READABLE MEDIUM, AND INFORMATION PROCESSING SYSTEM

CROSS REFERENCE TO RELATED APPLICATIONS

This application is a Continuation of International Application No. PCT/JP2020/011841, filed on Mar. 17, 2020, the entire contents of which are incorporated herein by reference.

FIELD

Embodiments described herein relate to an information processing device, an information processing method, a non-transitory computer readable medium, and an information processing system.

BACKGROUND

With an increase in a renewable energy, the rechargeable battery has been increasingly used for stabilizing an electrical grid and performing peak shaving of electric power consumption. To avoid a sudden failure of a rechargeable battery, it is required to monitor the state of a rechargeable battery. Especially, there is a need for a technique for evaluating the state of a rechargeable battery without stopping the operation of the rechargeable battery, that is, an online technique.

DETAILED DESCRIPTION

According to one embodiment, an information processing device, includes: a first state estimator configured to estimate a state of a target rechargeable battery, based on
first data including a charge amount and voltage value of a rechargeable battery
information including a state of the rechargeable battery, and
second data including a charge amount and voltage value of the rechargeable battery.

The technical background of embodiments will be described. There are known a technique of estimating the deterioration state of a rechargeable battery by performing special charge/discharge of the rechargeable battery offline and a technique of estimating the deterioration state of a rechargeable battery by statistical processing based on data during normal operation of the rechargeable battery. In the above technique of performing special charge/discharge, it is necessary for a rechargeable battery to be virtually placed offline so as to perform data collection for estimation. In other cases, the technique can only be applied in a case where charge is performed only for a fixed period of time, as in a case of an electric vehicle. In addition, the above technique using the statistical processing allows online processing; however, it is basically used to estimate the deterioration state based on a cycle deterioration, which is a deterioration caused due to repeated charge/discharge of a rechargeable battery. Consequently, this technique may cause an erroneous estimation for a deterioration in a different failure mode.

As an alternative scheme, there is also provided a scheme in which an open circuit voltage (OCV) curve is estimated from operation data and the deterioration state of a rechargeable battery is estimated from the estimated OCV curve. The OCV curve also shows a difference in a failure mode in its shape and therefore, there is a possibility that deteriorations other than a cycle deterioration may also be detected. However, this scheme relatively quantifies a current state in comparison with the past state of an identical rechargeable battery, and does not allow determination of the deterioration state only from current measurement data.

The embodiments realize that a state of a rechargeable battery, such as a deterioration state, is estimated online even when the rechargeable battery has operated not for so long a time since it has started operating. Hereinafter, the embodiments of the present invention will be described with reference to drawings.

First Embodiment

Figure 1:
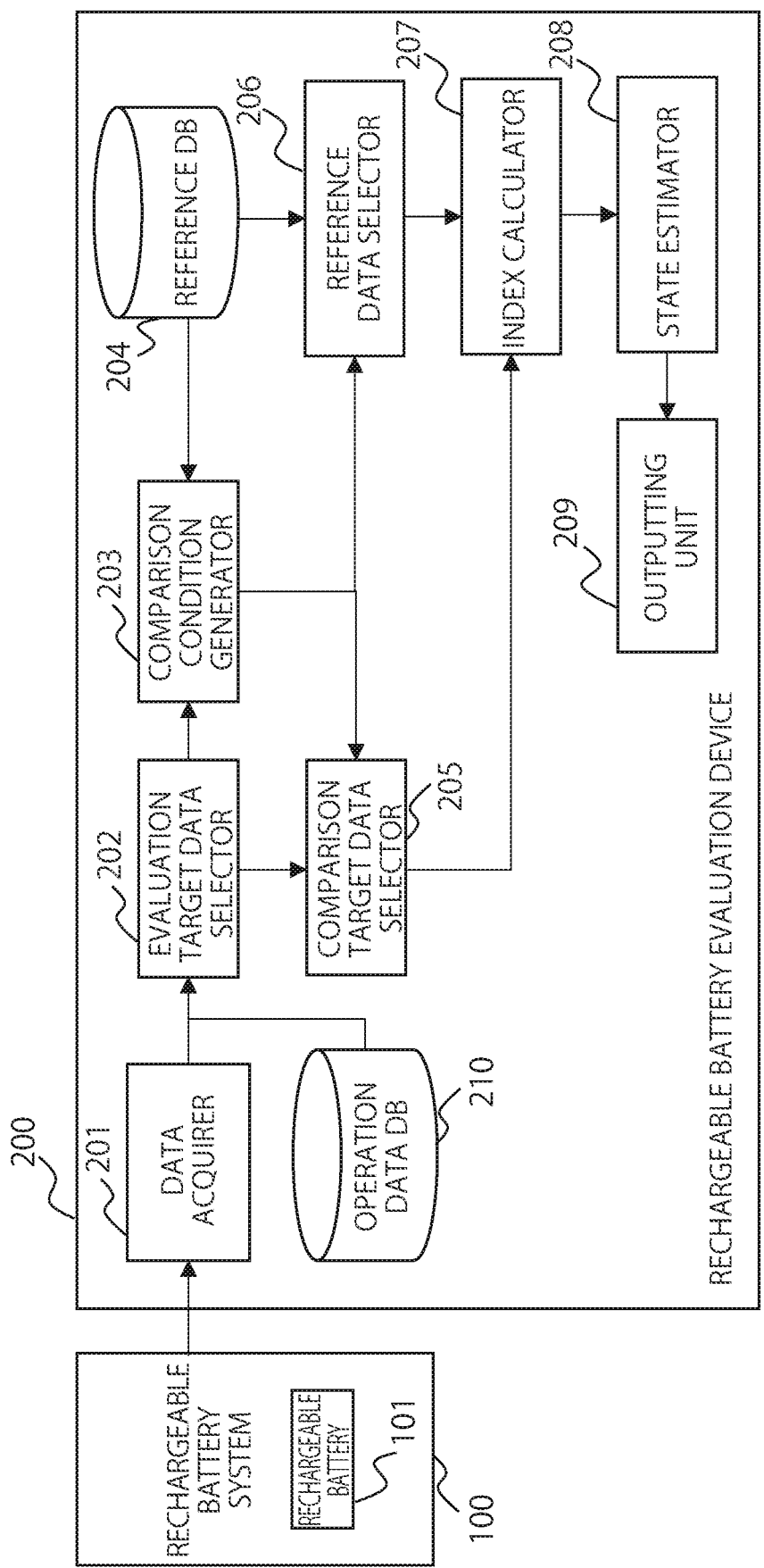
FIG. 1 is a block diagram of a rechargeable battery evaluation system according to an embodiment.

FIG. 1 is a block diagram of a rechargeable battery evaluation system that is an information processing system according to an embodiment. The rechargeable battery evaluation system in FIG. 1 includes a rechargeable battery system 100 and a rechargeable battery evaluation device 200 that is an information processing device.

The rechargeable battery system 100 includes a rechargeable battery 101 to be evaluated and various devices such as a control device that controls charge/discharge of the rechargeable battery 101. The rechargeable battery 101 is a chargeable/dischargeable battery. A rechargeable battery is also called a secondary battery; however, hereinafter it is uniformly called a rechargeable battery. Charge/discharge referred to in this embodiment includes at least either charge or discharge.

The rechargeable battery 101 is, in one example, a battery mounted on a movable body that operates with an electric energy as a power source, such as an electric vehicle (EV), an electric bus, a train, a next generation traffic system (LRT), a bus rapid transit system (BRT), an autonomous guided vehicle (AGV), an airplane, or a ship. The rechargeable battery 101 may also be a rechargeable battery that is mounted on an electrical device (such as a smartphone or a personal computer) or a rechargeable battery that stores electric power for demand response. The rechargeable battery 101 may be a rechargeable battery for other purposes.

The rechargeable battery 101 can be charged by a charger that is placed on a charging station, a road shoulder, a parking lot, or the like, or by a charger that is connected to an outlet or the like. The electric power stored in the rechargeable battery 101 may be capable of being discharged (reverse power flow) to an electrical grid via a charger. A scheme for transmitting electric power from a charger to the rechargeable battery 101 may be either a contact charging scheme or non-contact charging scheme.

The rechargeable battery 101 includes a plurality of battery panels. The plurality of battery panels are connected in series or in parallel. Alternatively, the plurality of battery panels are connected in series and in parallel.

Figure 2:
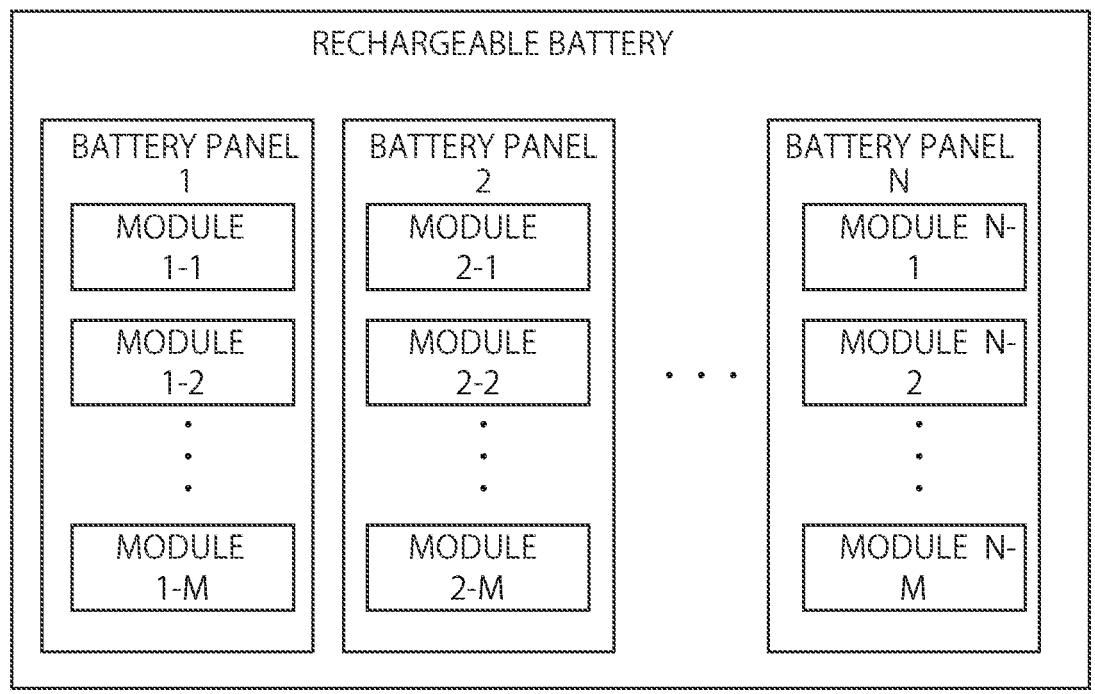
FIG. 2 is a diagram illustrating a configuration example of a rechargeable battery.

FIG. 2 illustrates a configuration example of the rechargeable battery 101. The rechargeable battery 101 includes battery panels "1, 2, . . . , and N". Each of the battery panels includes a plurality of modules. The battery panel "1" includes modules "1-1 to 1-M", the battery panel "2" includes modules "2-1 to 2-M", and the battery panel "N" includes modules "N-1 to N-M". The plurality of modules are connected in series, in parallel, or in series and in parallel. In this example, the number of modules included in each battery panel is the same; however, it does not have to be the same.

Figure 3:
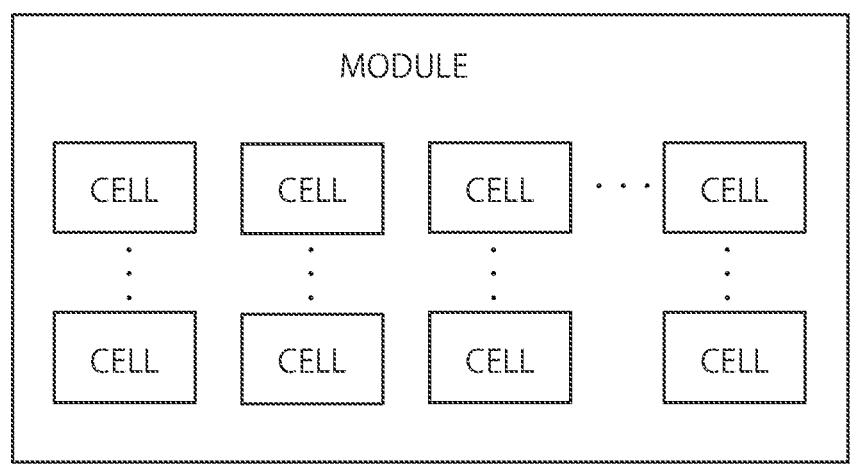
FIG. 3 is a diagram illustrating a configuration example of one module.

FIG. 3 illustrates a configuration example of one module. The module includes a plurality of battery cells. The plurality of battery cells are connected in series, in parallel, or in series and in parallel. In one example, two or more battery cells are connected in parallel and further, a plurality of those connected are connected in series.

The rechargeable battery evaluation device 200 includes a data acquirer 201, an evaluation target data selector (first selector) 202, a comparison condition generator (condition generator) 203, a reference DB 204, a comparison target data selector (second selector) 205, a reference data selector (third selector) 206, an index calculator 207, a state estimator (first state estimator) 208, an outputting unit 209, and an operation data DB 210.

The data acquirer 201 obtains data measured in the rechargeable battery 101 (referred to as operation data), at a fixed time interval from the rechargeable battery 101. In short, the data acquirer 201 obtains the operation data in time series. The data acquirer 201 stores the obtained operation data in the operation data DB (database). A unit by which the operation data is obtained may be any one of a cell, a module, a battery panel, and a rechargeable battery (a plurality of battery panels connected with each other). In the following description, a case is assumed in which a unit for operation data acquisition is a rechargeable battery. Estimation of the state of a rechargeable battery in this embodiment also includes a case in which any unit (level) of a cell, a module, a battery panel, or a rechargeable battery is targeted in the estimation.

The operation data includes information on a voltage, electric power, a state of charge (SOC), and temperature. The voltage is a charge voltage or a discharge voltage. Instead of an electric power value, or together with an electric power value, a current value may be obtained. An electric power value may be calculated by computing from a current value and a voltage value. In addition, an SOC may be calculated by obtaining a current value instead of an SOC value and integrating current. The SOC is an index indicating the charge amount of the battery. The SOC may be represented by a proportion obtained by dividing the amount of electric power (the amount of electric charge) stored in the rechargeable battery 101 by the capacity of the rechargeable battery 101.

The operation data DB 210 stores operation data that is obtained by the data acquirer 201.

Figures 4, 5:
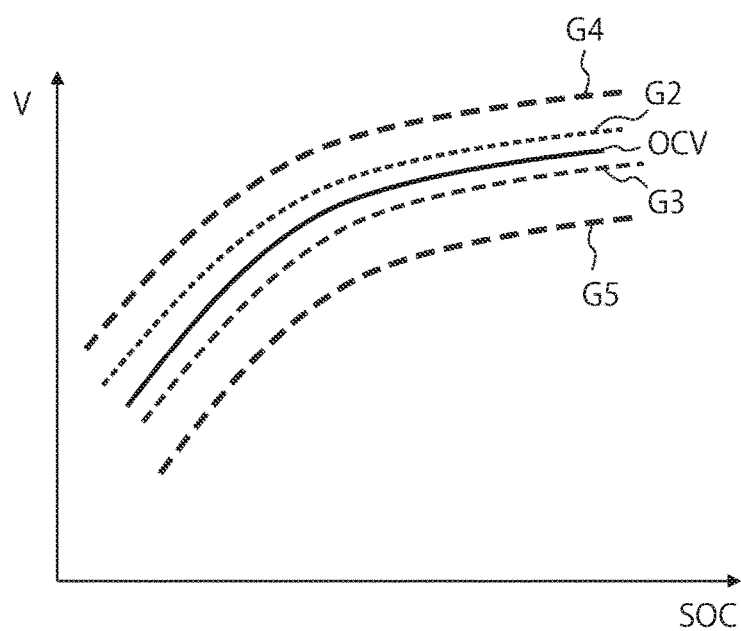
FIG. 4 is a diagram illustrating one example of an operation data DB.
FIG. 5 is a diagram illustrating an OCV curve and charge/discharge curves of a rechargeable battery.

FIG. 4 illustrates one example of the operation data DB 210. An example of operation data that is obtained every fixed time period for the rechargeable battery 101 is illustrated. The operation data includes a battery ID, a measurement time, an SOC, a current value (charge current value or discharge current value), a voltage value (charge voltage value or discharge voltage value), and a rechargeable battery temperature. The current value may include a positive or negative sign and discrimination between charge and discharge may be made by the sign. Other methods may be also used; for example, a column of a flag indicating charge or discharge may be provided to discriminate between charge and discharge by the flag. In FIG. 4, an example of operation data that is obtained at one second interval for the rechargeable battery 101 is illustrated.

The evaluation target data selector 202 selects operation data to be evaluated, from the operation data DB 210. The selected operation data is referred to as evaluation target data. The evaluation target data corresponds to second data that includes the charge amount and voltage value of a target rechargeable battery.

The evaluation target data selector 202 selects operation data based on a predetermined condition. The predetermined condition is, for example, a condition specifying a day, a period, or a temperature range. Alternatively, the predetermined condition may be a condition defining that SOC variations in or beyond a fixed range are included. For example, it may be a condition under which operation data including at least an SOC in the range of 70 to 90 is selected. The evaluation target data selector 202 may remove, from the selected operation data, insufficient data or data that is obtained in a state different from a normal operation state (for example, during testing or standby).

The reference DB 204 stores reference data that includes: an OCV curve, a charge curve or a discharge curve according to one or a plurality of current values (hereinafter, the charge curve and discharge curve are collectively referred to as charge/discharge curves); a deterioration state as a battery state; and a rechargeable battery ID. The reference data may be stored for a plurality of temperatures. Data including a charge curve, a discharge curve, or an OCV curve corresponds to first data including the charge amount and voltage value of a rechargeable battery.

FIG. 5 illustrates an OCV curve and charge/discharge curves of a rechargeable battery. A graph G1 shows an OCV curve, a graph G2 shows a charge curve of constant current charge of "1C", a graph G4 shows a charge curve of constant current charge of "3C", a graph G3 shows a discharge curve of constant current discharge of "1C", and a graph G5 shows a discharge curve of a constant current discharge of "3C". The "x[C]" represents a current value at which it takes "1/x[hour]" to charge a new rechargeable battery from full discharge to full charge. In general, a region surrounded by a certain SOC range and the graphs G2 and G3 of "1C" is narrower than a region surrounded by the same SOC range and the graphs G4 and G5 of "3C". The greater the current value becomes, the wider the region between the graphs becomes. The OCV curve and the charge/discharge curves are obtained, in one example, by plotting measurement values of the SOC and voltage.

The graphs G2 to G5 are those in a case of performing charge or discharge by a constant current scheme; however, they may be a charge curve and a discharge curve by using other schemes. For example, a scheme is acceptable in which at first, charge or discharge is performed at a constant current or constant electric power and when a fixed condition is established, it is switched to charge or discharge at a constant voltage. More specifically, it is acceptable that charge is performed at a constant current and when a voltage increases over a fixed value, it is switched to charge at a constant voltage. Similarly, in discharging, it is also acceptable that discharge is performed at a constant current and when a voltage decreases below a fixed value, it is switched to discharge at a constant voltage. A condition under which the charge/discharge curves are obtained as described above is referred to as a measurement condition. A current value such as "1C" or "3C", or a numerical value such as an electric power value which is a parameter in charge/discharge is referred to as a condition value. In an example of FIG. 5, two kinds of condition values of "1[C]" and "3[C]" are used. A charge curve and a discharge curve which are obtained with each of the condition values are stored for a plurality of rechargeable batteries and a plurality of battery temperatures.

The deterioration state of a rechargeable battery can be represented, in one example, by a deterioration degree which is obtained by dividing either an integrated amount of a current value [Ah] or an integrated amount of an electric power value [Wh] that is required for full charge of the rechargeable battery from a fully discharged state, by a rated capacity (for example, capacity in catalog); that is to say, by a value indicating a deterioration in the capacity. Alternatively, the deterioration state may be represented by soundness (SOH: state of health). There is a relation of "1−deterioration degree=soundness." The deterioration state calculated for each of the measurement conditions and condition values described above is stored in the reference DB 204. Even for a rechargeable battery in an actually identical deterioration state, a calculated deterioration state may differ depending on a measurement condition and a condition value.

Figures 6, 7:
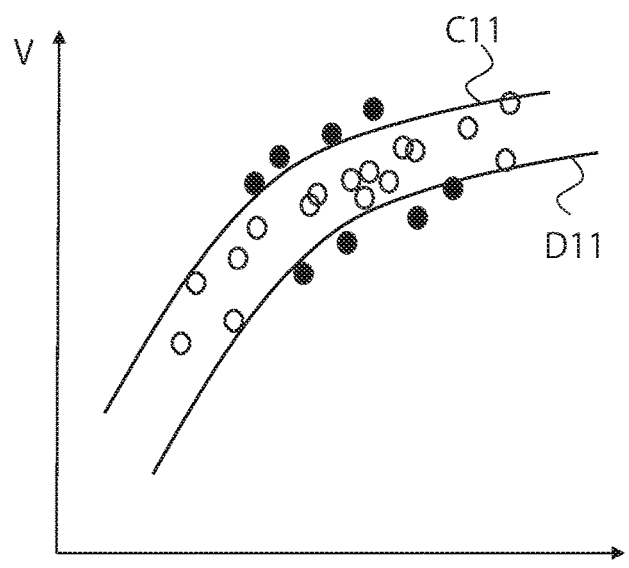
FIG. 6 is a diagram illustrating a specific example of a reference DB 204.
FIG. 7 is a diagram illustrating a first example of an index calculation method.

FIG. 6 illustrates a specific example of the reference DB 204. In a column of curve data, data of a charge curve, a discharge curve, or an OCV curve (curve data or graph data) is stored. The curve data may be a collection of pairs of SOC and voltage or may be a function for approximation of the collection. Alternatively, a link including a reference to the curve data may be stored in the column of curve data. In the case of an OCV curve, a condition value does not exist; however, a condition value may exist depending on a method of generating an OCV curve. For example, in the case of calculating an OCV curve by estimation, information or the like for specifying an estimation method to be used may be set as a condition value. For example, in the case of estimating an OCV by constant current charging, a current value (such as 1C) may be set as a condition value. For the deterioration state in the case of an OCV curve, a statistic (average, minimum value, maximum value, median value, or the like) of deterioration states calculated by other measurement conditions and condition values may be used; or it may be a deterioration state that is calculated by using a deterioration state calculation method using the OCV curve.

The comparison condition generator 203 generates, as comparison conditions, a condition for a data portion (comparison target data) to be estimated in the evaluation target data and a condition for reference data to be compared with the comparison target data, based on the evaluation target data and reference data that is stored in the reference DB 204.

(Example of Comparison Condition 1)

For example, assume that a current value in the evaluation target data is in the range of 0 [A] or larger and 25 [A] or smaller. Assume that a current value of a plurality of charge curves and a plurality of discharge curves which are stored in the reference DB 204 is 10[A] or 20[A].

In this case, selecting one or more pieces of reference data including a charge curve or discharge curve of 10 [A] and selecting, as comparison target data, a data portion including a current value of 10[A] or smaller are generated as comparison conditions.

In addition, selecting one or more pieces of reference data including a charge curve or discharge curve of 20[A] and selecting, as comparison target data, a data portion including a current value of 20[A] or smaller are generated as comparison conditions.

(Example of Comparison Condition 2)

A comparison condition may be generated by using temperature. Assume that a temperature of a rechargeable battery in the evaluation target data is in the range of 20 [° C.] or higher and 40 [° C.] or lower. Assume that a temperature of a charge curve and a discharge curve which are stored in the reference DB 204 is 25 [° C.] and 30 [° C.]. In this case, selecting one or more pieces of reference data including a charge curve or discharge curve of 25 [° C.] and selecting, as comparison target data, data of (25−T) [° C.] or higher and (25+T)[° C.] or lower from among pieces of the evaluation target data are generated as comparison conditions. In addition, selecting, as reference data, one or more pieces of reference data including a charge curve or discharge curve of 30 [° C.] and selecting, as comparison target data, data of (30−T) [° C.] or higher and (30+T)[° C.] or lower from among pieces of the evaluation target data are generated as comparison conditions. The "T" is a value that determines an allowable range of applicable temperature.

(Example of Comparison Condition 3)

Temperature is divided for each fixed section. For a plurality of pieces of data included in evaluation target data, data belonging to each section is identified and a frequency distribution of the data belonging to each section is created. Selecting data in a section having a fixed number or more of data pieces is set as a comparison condition.

(Example of Comparison Condition 4)

Selecting reference data including a temperature for which a charge curve and a discharge curve are stored in the reference DB 204 in common among a fixed number or more of rechargeable batteries is generated as a comparison condition.

The above described example 1 to example 4 may be combined. Furthermore, a comparison condition may be generated by a method other than the example 1 to example 4. For example, a comparison condition may be generated based on an electric power value or the range of an electric power value.

The comparison target data selector 205 selects data that satisfies a comparison condition generated by the comparison condition generator 203, from data included in evaluation target data. The selected data is referred to as comparison target data. Similarly, the reference data selector 206 selects reference data that satisfies the comparison condition generated by the comparison condition generator 203, from the reference DB 204.

For example, assume that a comparison condition is, as illustrated in the example 1 described earlier, selecting, as comparison target data, a data portion including a current value of 10[A] or smaller and selecting one or more (for example, all) pieces of reference data including a charge curve or discharge curve of 10[A]. In this case, a data portion including a current value of 10[A] or smaller is selected as comparison target data from the evaluation target data. When all the current values in data included in the evaluation target data are 10[A], all the evaluation target data is selected as comparison target data. In addition, all the reference data including a charge curve or discharge curve of 10[A] is selected from the reference DB 204. The index calculator 207 combines comparison target data selected by the comparison target data selector 205 and reference data selected by the reference data selector 206, and calculates an index for each combination. The combination of comparison target data and reference data is provided in plurality. For each combination, an index is calculated. An example of calculating an index will be described below.

(First Example of Index Calculation Method)

FIG. 7 is a diagram illustrating a first example of an index calculation method. As two pieces of reference data, a charge curve and a discharge curve of the same current value are selected. The example in the diagram illustrates an example in which a graph C11 of a charge curve and a graph D11 of a discharge curve are selected. The number of data pieces "N1" which are included in a region sandwiched between the charge curve C11 and the discharge curve D11, among pieces of comparison target data indicated by a plurality of plots (pairs of a voltage value and charge amount), is calculated. Open circles in the diagram represent data within the region. In addition, the number of data pieces "N2" outside the region, among pieces of the comparison target data, is calculated. Filled circles in the diagram represent data outside the region. Calculation is performed by using "N1/(N1+N2)" as an index (first index). In other words, a proportion of plots included within the region among all the plots included in the comparison target data is used as an index.

(Second Example of Index Calculation Method)

Figure 8:
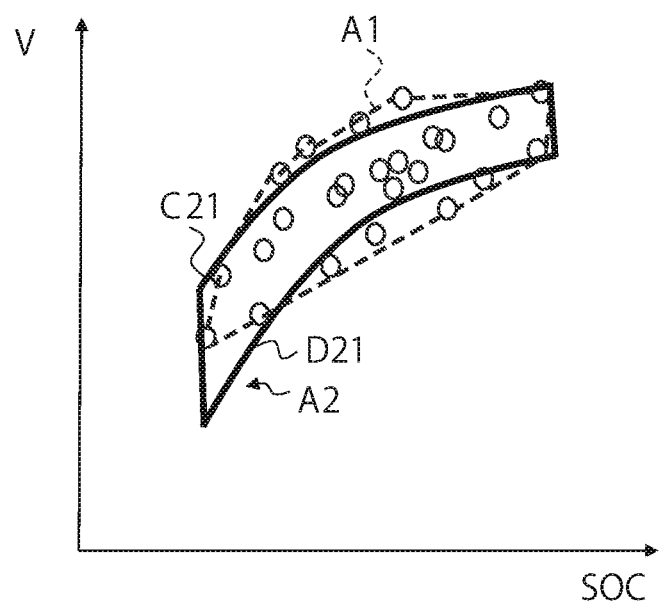
FIG. 8 is a diagram illustrating a second example of the index calculation method.

FIG. 8 is a diagram illustrating a second example of the index calculation method. A convex hull region A1 of comparison target data is calculated. In addition, a region A2 which is surrounded by an SOC range in which the comparison target data is distributed, a graph C21 of a charge curve, and a graph D21 of a discharge curve is calculated. The following index (second index) is calculated as a value representing a covering relation between the region A1 and the region A2.

$$\max\left(0, \frac{S(A1 \cap A2) - S(\overline{A1} \cap A2) - S(A1 \cap \overline{A2})}{S(A1 \cup A2)}\right) \quad \text{[Math. 1]}$$

A pair of reference data with which the index (second index) becomes the maximum or a threshold value or greater is selected. The "S(X)" represents an area of a region X. The larger an area in which the region A1 and the region A2 overlap with each other is, the greater the index becomes; and the smaller an area of a OR between the region A1 and the region A2 is, the greater the index becomes. In addition, the smaller an area in which the region A1 and the region A2 do not overlap with each other is, the greater the index becomes.

(Third Example of Index Calculation Method)

Figure 9:
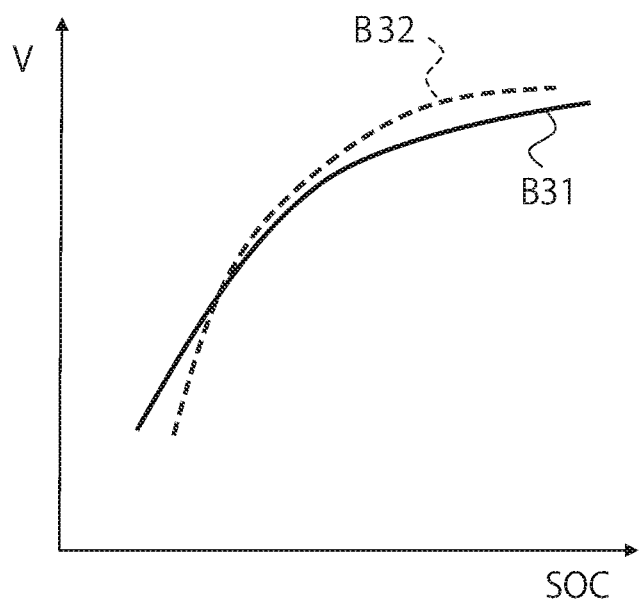
FIG. 9 is a diagram illustrating a third example of the index calculation method.

FIG. 9 is a diagram illustrating a third example of the index calculation method. A degree of similarity between an OCV curve of reference data and an OCV curve estimated from comparison target data is calculated as an index (third index). Reference data with which the degree of similarity becomes the maximum or a threshold value or greater is selected.

If an OCV curve is not included in reference data, a curve passing through a center between a charge curve and a discharge curve may be used as an OCV curve.

One example of a method of estimating an OCV curve from comparison target data will be described. An SOC range is divided into a plurality of sections. A representative value of an SOC (median value or mean value or the like) in a section and an average voltage value of comparison target data belonging to the section are calculated. A curve including an SOC median value and an average voltage value for each section is determined as an estimated OCV curve. An OCV curve for evaluation target data may be estimated by a similar method.

In FIG. 9, an OCV curve B31 of reference data and an OCV curve B32 estimated from comparison target data are illustrated as one example. An OCV curve that is the most similar to the OCV curve B32 of comparison target data is selected from among a plurality of OCV curves of reference data. The degree of similarity is, for example, calculated based on a difference between the two OCV curves. For example, a voltage difference is calculated at a fixed interval in a predetermined SOC range, and it is determined that the smaller a total sum of the differences is, the higher the degree of similarity is. In this case, the total sum of the differences corresponds to an index to be calculated (third index). As the third index, the maximum value of the difference may be used instead of the total sum of the differences. Alternatively, it is acceptable that a predetermined SOC range is divided into a plurality of sections, an OCV mean value for each section is calculated for each OCV curve, and a total sum of differences in the OCV mean value for each section is determined as a degree of similarity.

(Fourth Example of Index Calculation Method)

Figure 10:
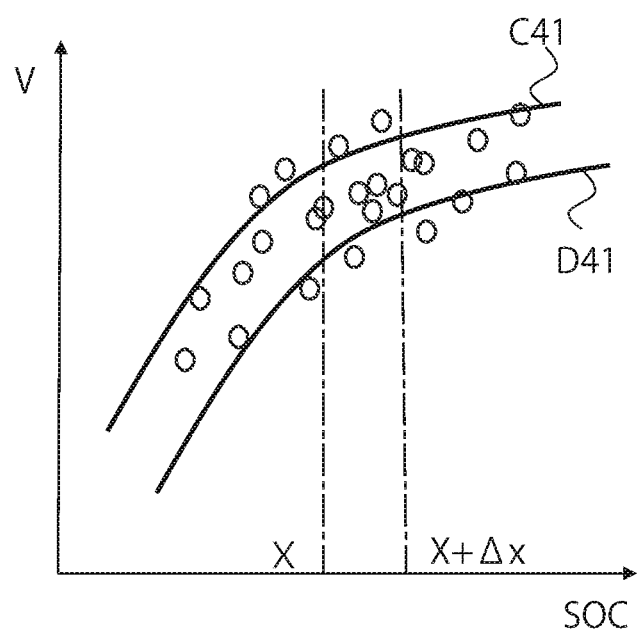
FIG. 10 is a diagram illustrating a fourth example of the index calculation method.

FIG. 10 is a diagram illustrating a fourth example of the index calculation method. An average voltage (defined as "$\mu V$") of evaluation target data in an SOC section [X, X+$\Delta$X] and a voltage standard deviation (defined as "$\sigma V$") are calculated. A normal distribution "N" in which the average is "$\mu V$" and a distribution is the square of "$\sigma V$" is generated as a distribution of voltage values. The normal distribution "N" is calculated by using, as a distance in a section [X, X+$\Delta$X], a difference between a predetermined value and a value obtained by integration between an average voltage within the section of a discharge curve (defined as "V−") and an average voltage within the section of a charge curve (defined as "V+"). The predetermined value may be any value. The "X" is changed within a predetermined SOC range, for example, at a fixed value interval, and each distance is calculated. Calculation is performed by using a total sum of distances or the maximum value as an index (fourth index).

(Other Examples of Index Calculation Method)

In the third example described above, comparison of OCV curves is performed; however, comparison between charge curves or comparison between discharge curves may be performed. For example, calculation is performed using a degree of similarity between a charge curve of reference data and a charge curve of comparison target data as an index. It is only required that data in a period for which charging is continuously performed is used as comparison target data. For a method of calculating a degree of similarity, it is only necessary to use a method similar to that in the third example.

The state estimator 208 selects one or a plurality of pieces of reference data based on an index calculated by the index calculator 207; and estimates a deterioration state of the rechargeable battery 101 to be evaluated, based on the selected reference data. As described above, the deterioration state can be represented by a degree of deterioration or soundness (SOH). In one example, a pair of reference data pieces with which an index value is the maximum or the minimum is selected according to a type of an index used. For example, in the case of an index in the first or the second example, a pair of reference data pieces with which the index becomes the maximum or a threshold value or greater is selected. In the case of an index in the third or the fourth example, a pair of reference data pieces with which the index is the minimum or smaller than a threshold is selected. A statistic (mean, minimum, maximum, median, or the like) of deterioration states of the selected pair of reference data pieces may be determined as the deterioration state of the rechargeable battery 101. Alternatively, all deterioration states of the selected reference data may be determined as the deterioration state of the rechargeable battery 101. When one piece of reference data is selected, a deterioration state of the reference data may be determined as the deterioration state of the rechargeable battery 101.

When a threshold value of an index is provided and the maximum value of the index is smaller than a threshold value (or when the minimum value is a threshold value or greater), information indicating that reference data appropriate for evaluation does not exist in the reference DB 204 and the deterioration state of the rechargeable battery 101 cannot be evaluated may be generated.

In addition, the state estimator 208 may generate information which has been used for estimation of the deterioration state. For example, there is an index value which has been calculated by the index calculator 207 for reference data used for estimation of the deterioration state. In addition, there are graphs in which either a charge curve or a discharge curve that is included in one or more pieces of reference data used for estimation of the deterioration state, or the both and comparison target data are respectively plotted.

The outputting unit 209 outputs both information on the deterioration state of the rechargeable battery 101 which has been estimated by the state estimator 208 and information which has been used for the estimation. The outputting unit 209 is, for example, a display device that displays data, a communication device that transmits data by radio or by cable, or a printer that prints data.

Figure 11:
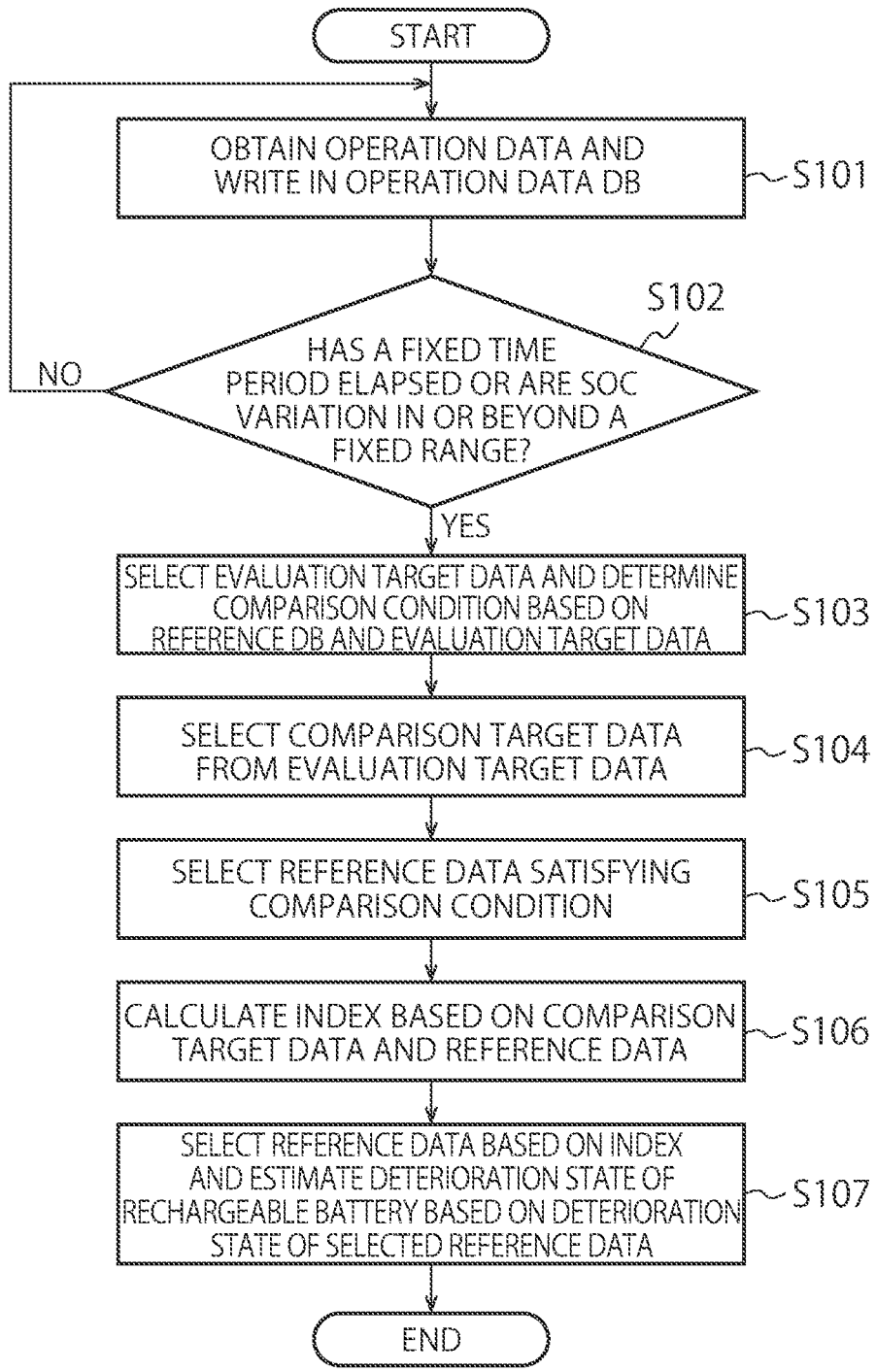
FIG. 11 is a flowchart of one example of an operation of a rechargeable battery evaluation device according to the embodiment.

FIG. 11 is a flowchart of one example of an operation of the rechargeable battery evaluation device 200 according to this embodiment. The data acquirer 201 obtains operation data from the rechargeable battery 101 and stores the obtained operation data in the operation data DB 210 (S101). The evaluation target data selector 202 selects operation data to be evaluated, as evaluation target data from the operation data DB 210 (YES at S102, S103). In one example, the evaluation target data selector 202 selects operation data for a fixed period at fixed period intervals. In another example, it selects operation data that includes SOC variations in or beyond a fixed range.

The comparison condition generator 203 determines a comparison condition based on the obtained evaluation target data and reference data stored in the reference DB 204. The comparison condition is, in one example, generated as a condition based on at least one of a current value, a temperature, a current value, or the like (S103).

The comparison target data selector 205 selects, as comparison target data, a data portion satisfying the comparison condition, from the evaluation target data (S104). The reference data selector 206 selects one or more pieces of reference data satisfying the comparison condition, from the reference DB 204 (S105).

The index calculator 207 calculates an index based on the comparison target data and the one or more pieces of reference data. As examples of the index, the indices in the first to fourth examples described earlier are provided.

The state estimator 208 selects reference data from among the pieces of reference data selected at step S105, based on the calculated index. For example, either reference data or a pair of reference data pieces with which an index value is the maximum or the minimum is selected. It estimates a deterioration state of the rechargeable battery 101 based on the selected reference data or pair of reference data pieces (S106). In one example, if one piece of reference data is selected, a deterioration state of the selected reference data is determined as the deterioration state of the rechargeable battery 101. In another example, if a pair of reference data pieces is selected, a statistic (mean value or the like) of deterioration states of the pair of reference data pieces is determined as the deterioration state of the rechargeable battery 101. The outputting unit 209 outputs information indicating the deterioration state estimated by the state estimator 208.

As mentioned above, according to this embodiment, a voltage-SOC curve or a pair of voltage-SOC curves which is similar to a voltage-SOC curve based on the operation data of a target rechargeable battery is specified from voltage-SOC curves of a plurality of rechargeable batteries each of which is associated with a deterioration state. Based on a deterioration state associated with the specified curve or a pair of deterioration states associated with the specified pair of curves, the deterioration state of the target rechargeable battery is estimated. As a result, the deterioration state of the rechargeable battery can be estimated with high accuracy, without stopping the operation of the rechargeable battery. In addition, the deterioration state of the rechargeable battery can be estimated even when the time that has elapsed after the start of the operation of the rechargeable battery is short.

Second Embodiment

In the rechargeable battery evaluation device 200 of the first embodiment, a processor that evaluates the rechargeable battery 101 by another algorithm is added and a function of comparing an estimation result in the first embodiment and an estimation result by the other algorithm is added.

Figure 12:
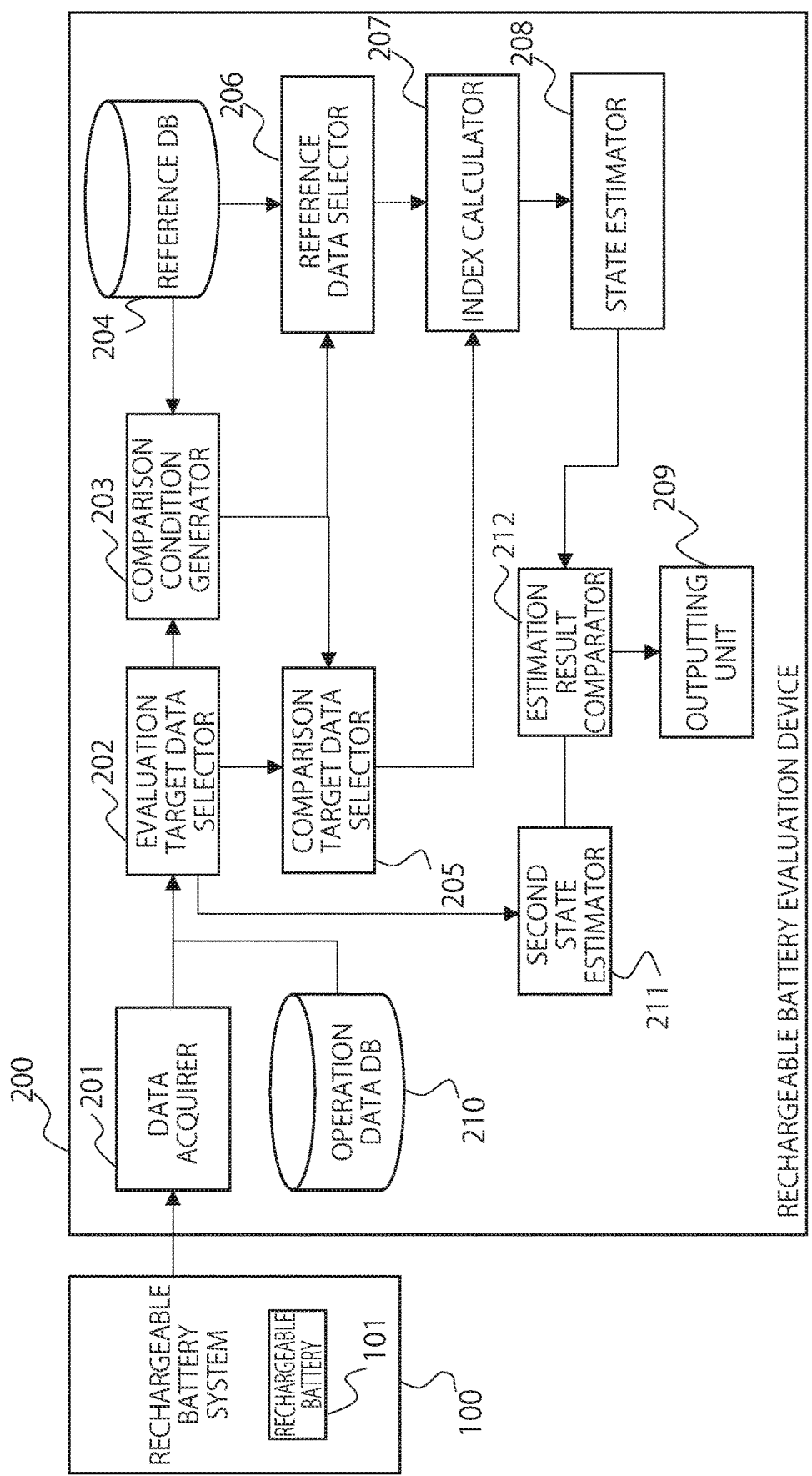
FIG. 12 is a block diagram of a rechargeable battery evaluation system according to a second embodiment.

FIG. 12 is a block diagram of a rechargeable battery evaluation system according to a second embodiment. A second state estimator 211 that estimates the state of the rechargeable battery 101 and an estimate result comparator 212 that compares an estimation result of the state estimator 208 and an estimation result of the second state estimator 211 have been added.

The second state estimator 211 estimates the state (deterioration state, for example) of the rechargeable battery 101, based on evaluation target data selected by the evaluation target data selector 202. A method for the estimation may be any method as long as it is a method different from that of the state estimator 208. In one example, in a coordinate system where an SOC and voltage are taken on each axis, data including an SOC and voltage (charge voltage or discharge voltage) is plotted based on the evaluation target data. Voltage variations (standard deviation, for example) in a specific SOC range (narrow SOC range, for example) are calculated. The calculated standard deviation is applied to a model in which a standard deviation and a deterioration state are associated with each other in advance, and thereby the deterioration state is estimated (see Patent Literature 1). For example, assuming that the deterioration state (SOH) is "Y" and the standard deviation is "X," "Y=α1 X+α2" is used as a model. The "α1" and "α2" are parameters that are calculated by model learning in advance. The model learning can be performed by obtaining data that includes a standard deviation and a deterioration state for a plurality of rechargeable batteries and using the obtained data as teacher data.

The estimation result comparator 212 compares a deterioration state estimated by the state estimator 208 and a deterioration state estimated by the second state estimator 211. When a difference in values of the deterioration states is equal to or more than a fixed degree, the estimation result comparator 212 generates information indicating that there is a divergence between both the estimation results. The outputting unit 209 outputs the generated information.

Third Embodiment

A third embodiment stores a deterioration state estimated by the state estimator 208, in an estimation result DB 221. It outputs the predicted values of both a temporal change of the deterioration state and a future deterioration state, based on a plurality of deterioration states stored in the estimation result DB 221.

Figure 13:
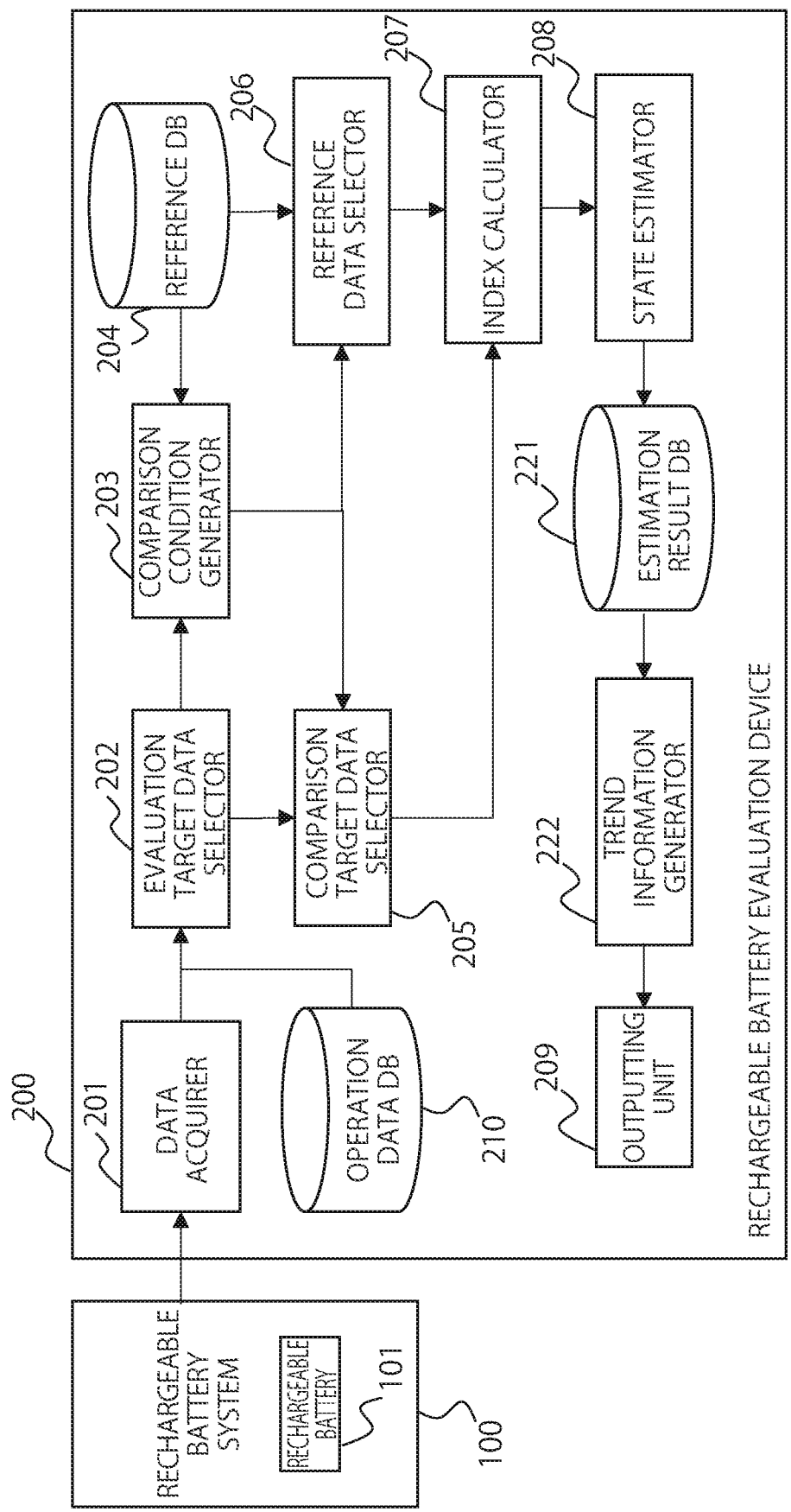
FIG. 13 is a block diagram of a rechargeable battery evaluation system according to a third embodiment.

FIG. 13 is a block diagram of a rechargeable battery evaluation system according to the third embodiment. In the block diagram of the first embodiment, the estimation result DB 221 and a trend information generator 222 are added.

The estimation result DB 221 stores an evaluation result that includes a deterioration state estimated by the state estimator 208, together with both a time at which evaluation of the deterioration state has been performed (evaluation time) and temporal electric power information for a rechargeable battery from the start of using the rechargeable battery to an evaluation time. The temporal electric power information, in one example, includes at least one of a cumulative value of charged electric power amount [Wh], a cumulative value of discharged power amount [Wh], a cumulative value of charged electricity amount [Ah], and a cumulative value of discharged power electricity amount [Ah].

The trend information generator 222 generates trend information in which a deterioration state of the rechargeable battery 101 is associated with an evaluation time and temporal electric power information. The trend information is data indicating that the deterioration state of the rechargeable battery 101 changes (deteriorates) together with temporal information. The outputting unit 209 outputs the trend information on a screen.

Figure 14:
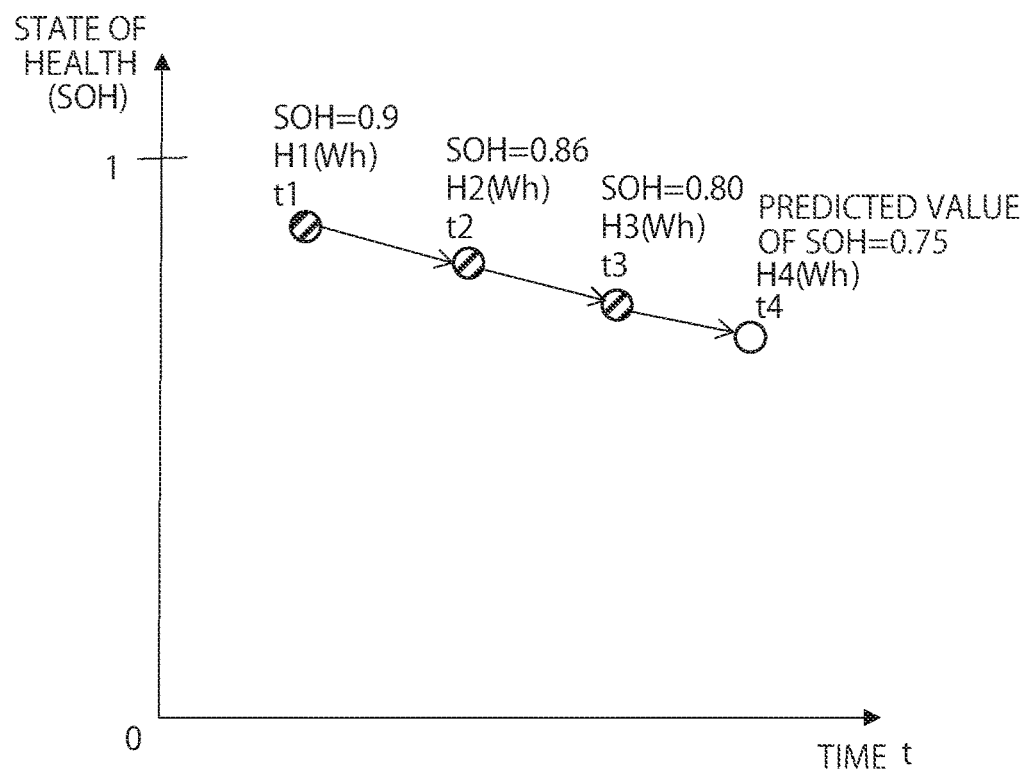
FIG. 14 is a display example of trend information.

FIG. 14 is a display example of the trend information. A horizontal axis indicates time (t) and a vertical axis indicates a soundness (SOH). Results of estimating soundness for three times at times "t1" to "t3" are plotted by hatched circles. As the temporal electric power information, cumulative values of charged electric power amount H1 to H3 are displayed. The cumulative value of charged electric power amount increases with time and therefore, there is a relation of "H3>H2>H1."

The trend information generator 222 may estimate a future change in the deterioration state from the trend information. A predicted future value is output by using a predetermined model. For example, assume that a model is defined by an expression of a linear straight line as:

$$Y=\beta 1 \times K1 + \beta 2 \times K2 + \beta 3$$

where "Y" represents a deterioration state, "K1" represents temporal electric power information, and "K2" represents an evaluation time of the rechargeable battery (time from the start of using the rechargeable battery to the evaluation time). "β1," "β2," and "β3" are coefficients that are calculated by model learning in advance.

By substituting future temporal electric power information and a future estimation time into respective "Ks" in the model, a predicted value of the deterioration state can be obtained as "Y." In FIG. 14, soundness (SOH) estimated for a time t4 is plotted by an open circle.

The "β1" to "β2" are calculated by using, as teacher data, a plurality of pieces of data in which a plurality of deterioration states, temporal electric power information, and evaluation times, which are stored in the estimation result DB 221, are included. All data in the estimation result DB 221 may be used, or alternatively, partial data may be used. In addition, the temporal electric power information may be divided into a plurality of sections and a coefficient for a model may be calculated for each section. In calculating an estimated value of a future deterioration state, a coefficient that is calculated for a section close to a current time may be used.

(Hardware Configuration)

Figure 15:
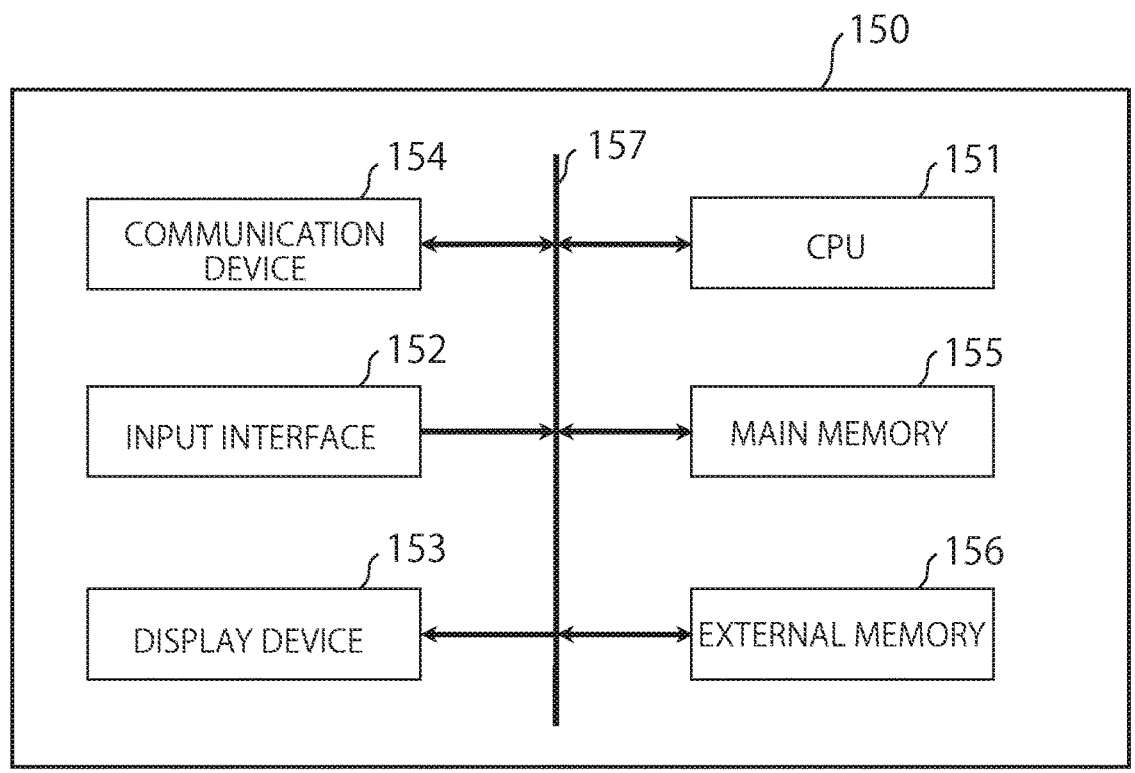
FIG. 15 is a diagram illustrating an example of a hardware configuration of a rechargeable battery evaluation device.

FIG. 15 illustrates an example of a hardware configuration of a rechargeable battery evaluation device according to an embodiment of the present invention. This hardware configuration can be used for the rechargeable battery evaluation device 200 according to each of the embodiments described earlier. The hardware configuration in FIG. 15 is formed as a computer 150. The computer 150 includes a CPU 151, an input interface 152, a display device 153, a communication device 154, a main memory 155, and an external memory 156, which are connected to be mutually communicable through a bus 157.

The input interface 152 obtains measurement data of the rechargeable battery 101 via wiring or the like. The input interface 152 may be operating means through which a user provides an instruction to this device. Examples of the operating means include a keyboard, a mouse, and a touch panel. The communication device 154 includes radio or cable communicating means and performs cable or radio communication with an EV 200. Measurement data may be obtained via the communication device 154. The input interface 152 and the communication device 154 may each be constituted by an individual circuit such as an integrated circuit, or may be constituted by a single circuit such as an integrated circuit. The display device 153 is, for example, a liquid crystal display device, an organic EL display device, a CRT display device, or the like. The display device 153 corresponds to the outputting unit 209 in FIG. 1.

The external memory 156 includes, for example, a storage medium such as an HDD, an SSD, a memory device, a CD-R, a CD-RW, a DVD-RAM, or DVD-R. The external memory 156 stores a program for causing the CPU 151 as a processor to execute a function of each processor of the rechargeable battery evaluation device 200. In addition, each DB included in the rechargeable battery evaluation device 200 is also included in the external memory 156. Although only one external memory 156 is indicated here, a plurality thereof may exist.

The main memory 155, in which a control program stored in the external memory 156 is deployed under control of the CPU 151, stores data necessary for execution of the program, data generated by execution of the program, and the like. The main memory 155 includes any memory or a storage, for example, a volatile memory (DRAM, SRAM, or the like) or a nonvolatile memory (NAND flash memory, MRAM, or the like). The control program deployed in the main memory 155 is executed by the CPU 151, thereby causing a function of each processor of the rechargeable battery evaluation device 200 to be executed. Each DB included in the rechargeable battery evaluation device 200 may also be included in the main memory 155.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing device, comprising:
a first state estimator configured to
select a pair of charge curve data and discharge curve data from a set of one or more first reference data and a set of one or more second reference data, based on a distribution between charge amounts and voltage values in a plurality of operation data each including a charge amount and a voltage value acquired from a target rechargeable battery that is being recharged and discharged,
the one or more first reference data each including charge curve data of a rechargeable battery and including
information on a state of the rechargeable battery, the charge curve data representing a relationship between a charge amount and a voltage value of the rechargeable battery,
the one or more second reference data each including discharge curve data of a rechargeable battery and including information on a state of the rechargeable battery, the discharge curve data representing a relationship between a charge amount and a voltage value of the rechargeable battery,
acquire information on states of rechargeable batteries corresponding to the charge curve data and the discharge curve data in the selected pair from the first reference data and the second reference data including the charge curve data and the discharge curve data in the selected pair, and
estimate a state of the target rechargeable battery based on the acquired information.

2. The information processing device according to claim 1, comprising:
an index calculator configured to calculate an index based on the charge curve data and the discharge curve data in the selected pair and the plurality of operation data, wherein the first state estimator selects the pair of charge curve data and discharge curve data, based on the index.

3. The information processing device according to claim 2, wherein
the first state estimator calculates a statistic of the information on the states of the rechargeable batteries corresponding to the charge curve data and the discharge curve data in the selected pair, and determines the state of the target rechargeable battery based on the statistic.

4. The information processing device according to claim 2, wherein
the index calculator plots the plurality of operation data in a coordinate system, selecting one charge curve data and one discharge curve data each in the one or more first reference data and the one or more second reference data, develops the one charge curve data and the one discharge curve data in the coordinate system, and calculates the index based on a number of plot points surrounded by the charge curve data and the discharge curve data in the coordinate system.

5. The information processing device according to claim 2, wherein
the index calculator plots the plurality of operation data in a coordinate system, calculates a first region surrounding plot points, selects one charge curve data and one discharge curve data each in the one or more first reference data and the one or more second reference data, specifies a range of charge amounts in which the plot points exists in the coordinate system, specifies a second region surrounded by the range, the one charge curve data and the one discharge curve data, and calculates the index according to an area where the first region and the second region overlap.

6. The information processing device according to claim 2, wherein
the first reference data include a first condition associated with a current value, temperature, or electric power value of the rechargeable battery;
the second reference data include a second condition associated with a current value, temperature, or electric power value of the rechargeable battery and
the rechargeable battery is charged and discharged based on a third condition associated with a current value, temperature, or electric power value of the rechargeable battery,
the index calculator selects one charging curve data having the first condition that matches the third condition and one discharge curve data having the second condition that matches the third condition in the one or more first reference data and the one or more second reference data.

7. The information processing device according to claim 2, wherein
the index calculator calculates mean and standard deviation of the voltage values in a first charge amount range based on the plurality of operation data, selects one charge curve data and one discharge curve data each in the one or more first reference data and in the one or more second reference data, and integrates a normal distribution of voltage values based on the mean and the standard deviation between mean of the voltage values in the first charge range of the charge curve data and mean of the voltage values in the first charge range of the discharge curve data, and calculates the index based on a difference between the integral and a predetermined value.

8. The information processing device according to claim 2, wherein the index calculator selects the pair of the charge curve data and the discharge curve data for which the value of the index is a maximum or above a threshold value.

9. The information processing device according to claim 2, wherein the index calculator selects the pair of the charge curve data and the discharge curve data for which the value of the index is a minimum or less than a threshold value.

10. The information processing device according to claim 1, comprising:
   a second state estimator that calculates variation of voltage values in a certain charge amount range, based on the plurality of operation data and estimates the state of the target rechargeable battery, based on the variation of the voltage values; and
   an estimation result comparator performs comparison between the state estimated by the first state estimator and the state estimated by the second state estimator and generate information based on the comparison.

11. The information processing device according to claim 1, wherein
   the state is a deterioration state.

12. The information processing device according to claim 1, further comprising:
   a database storing the set of the one or more first reference data and the set of the one or more second reference data.

13. An information processing method, comprising:
   selecting a pair of charge curve data and discharge curve data from a set of one or more first reference data and a set of one or more second reference data, based on a distribution between charge amounts and voltage values in a plurality of operation data each including a charge amount and a voltage value acquired from a target rechargeable battery that is being recharged and discharged,
      the one or more first reference data each including charge curve data of a rechargeable battery and including information on a state of the rechargeable battery, the charge curve data representing relationship between a charge amount and a voltage value of the rechargeable battery,
      the one or more second reference data each including discharge curve data of a rechargeable battery and including information on a state of the rechargeable battery, the discharge curve data representing a relationship between a charge amount and a voltage value of the rechargeable battery;
   acquiring information on states of rechargeable batteries corresponding to the charge curve data and the discharge curve data in the selected pair from the first reference data and the second reference data including the charge curve data and the discharge curve data in the selected pair; and
   estimating a state of the target rechargeable battery based on the acquired information.

14. A non-transitory computer readable medium having a computer program stored therein which when executed by a computer, causes the computer to perform processes, comprising:
   selecting a pair of charge curve data and discharge curve data from a set of one or more first reference data and a set of one or more second reference data, based on a distribution between charge amounts and voltage values in a plurality of operation data each including a charge amount and a voltage value acquired from a target rechargeable battery that is being recharged and discharged,
      the one or more first reference data each including charge curve data of a rechargeable battery and including information on a state of the rechargeable battery, the charge curve data representing a relationship between a charge amount and a voltage value of the rechargeable battery,
      the one or more second reference data each including discharge curve data of a rechargeable battery and including information on a state of the rechargeable battery, the discharge curve data representing a relationship between a charge amount and a voltage value of the rechargeable battery;
   acquiring information on states of rechargeable batteries corresponding to the charge curve data and the discharge curve data in the selected pair from the first reference data and the second reference data including the charge curve data and the discharge curve data in the selected pair; and
   estimating a state of the target rechargeable battery based on the acquired information.

15. An information processing system, comprising:
   a target rechargeable battery;
   a data acquirer configured to acquire a plurality of operation data including a charge amount and voltage value of the rechargeable battery that is being recharged and discharged; and
   a first state estimator configured to
   select a pair of charge curve data and discharge curve data from a set of one or more first reference data and a set of one or more second reference data, based on distribution between charge amounts and voltage values in the plurality of operation data,
      the one or more first reference data each including charge curve data of a rechargeable battery and including information on a state of the rechargeable battery, the charge curve data representing a relationship between a charge amount and a voltage value of the rechargeable battery,
      the one or more second reference data each including discharge curve data of a rechargeable battery and including information on a state of the rechargeable battery, the discharge curve data representing a relationship between a charge amount and a voltage value of the rechargeable battery,
   acquire information on states of rechargeable batteries corresponding to the charge curve data and the discharge curve data in the selected pair from the first reference data and the second reference data including the charge curve data and the discharge curve data in the selected pair,
   estimate a state of the target rechargeable battery based on the acquired information.

* * * * *